United States Patent
Narayanan et al.

(10) Patent No.: US 10,274,538 B2
(45) Date of Patent: Apr. 30, 2019

(54) FULL PAD COVERAGE BOUNDARY SCAN

(71) Applicant: TEXAS INSTRUMENTS INCORPORATED, Dallas, TX (US)

(72) Inventors: Prakash Narayanan, Bangalore (IN); Rajesh Mittal, Bangalore (IN); Rajat Mehrotra, New Dehli (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 17 days.

(21) Appl. No.: 15/722,975

(22) Filed: Oct. 2, 2017

(65) Prior Publication Data

US 2018/0045778 A1 Feb. 15, 2018

Related U.S. Application Data

(62) Division of application No. 15/143,454, filed on Apr. 29, 2016, now Pat. No. 9,791,505.

(51) Int. Cl.
*G01R 31/317* (2006.01)
*G01R 31/3185* (2006.01)
*G01R 31/3177* (2006.01)

(52) U.S. Cl.
CPC ... *G01R 31/31713* (2013.01); *G01R 31/3177* (2013.01); *G01R 31/318536* (2013.01); *G01R 31/318572* (2013.01)

(58) Field of Classification Search
CPC ...... G01R 31/31713; G01R 31/318536; G01R 31/3177
See application file for complete search history.

(56) References Cited

U.S. PATENT DOCUMENTS

| | | | | | |
|---|---|---|---|---|---|
| 5,109,190 | A | * | 4/1992 | Sakashita | G01R 31/318555 324/73.1 |
| 5,150,044 | A | * | 9/1992 | Hashizume | G01R 31/318555 324/750.3 |
| 5,231,314 | A | * | 7/1993 | Andrews | G01R 31/318552 324/762.02 |
| 5,270,642 | A | * | 12/1993 | Parker | G01R 31/318558 714/727 |
| 5,404,359 | A | * | 4/1995 | Gillenwater | G01R 31/31701 324/73.1 |
| 5,448,575 | A | * | 9/1995 | Hashizume | G01R 31/318555 714/724 |
| 5,471,481 | A | * | 11/1995 | Okumoto | G01R 31/318555 324/73.1 |
| 5,477,545 | A | * | 12/1995 | Huang | G01R 31/318541 324/762.02 |

(Continued)

FOREIGN PATENT DOCUMENTS

JP 2003228999 8/2003

*Primary Examiner* — Joseph D Torres
(74) *Attorney, Agent, or Firm* — Ronald O. Neerings; Charles A. Brill; Frank D. Cimino

(57) ABSTRACT

An integrated circuit, comprising functional circuitry and testing circuitry. A first set of pads is operable in a first state for communicating testing signals to the testing circuitry and operable in a second state for communicating input/output signals to the functional circuitry. A second set of pads, differing from the first set of pads, is operable in the second state for communicating testing signals to the testing circuitry for testing signals associated in the second state with the first set of pads.

24 Claims, 5 Drawing Sheets

(56) References Cited

U.S. PATENT DOCUMENTS

| | | | | |
|---|---|---|---|---|
| 5,513,188 A * | 4/1996 | Parker | G01R 31/318307 | 714/727 |
| 5,592,493 A * | 1/1997 | Crouch | G01R 31/318536 | 324/73.1 |
| 5,615,217 A * | 3/1997 | Horne | G01R 31/318558 | 714/727 |
| 5,710,779 A * | 1/1998 | Whetsel | G01R 31/318541 | 714/30 |
| 5,736,849 A * | 4/1998 | Terayama | G01R 31/31855 | 324/750.24 |
| 5,974,578 A * | 10/1999 | Mizokawa | G01R 31/3167 | 714/727 |
| 6,173,428 B1 * | 1/2001 | West | G01R 31/318552 | 714/727 |
| 6,351,836 B1 | 2/2002 | Tsujii | | |
| 6,519,728 B2 * | 2/2003 | Tsujii | G01R 31/2884 | 324/750.3 |
| 6,711,708 B1 * | 3/2004 | Shimomura | G01R 31/318536 | 714/727 |
| 6,851,079 B1 * | 2/2005 | Hergott | G01R 31/318572 | 714/724 |
| 6,925,583 B1 * | 8/2005 | Khu | G01R 31/318544 | 714/30 |
| 7,036,061 B2 | 4/2006 | Muhtaroglu | | |
| 7,398,441 B1 * | 7/2008 | Gee | G01R 31/318533 | 714/727 |
| 7,406,642 B1 * | 7/2008 | Lau | G01R 31/31715 | 714/727 |
| 7,702,983 B2 | 4/2010 | Casarsa | | |
| 9,389,944 B1 * | 7/2016 | Press | G01R 31/3177 | |
| 2003/0163773 A1 * | 8/2003 | O'Brien | G01R 31/318558 | 714/726 |
| 2007/0011542 A1 * | 1/2007 | Mukherjee | G01R 31/318541 | 714/738 |
| 2016/0282414 A1 * | 9/2016 | Gielarowski | G01R 31/31723 | |

* cited by examiner

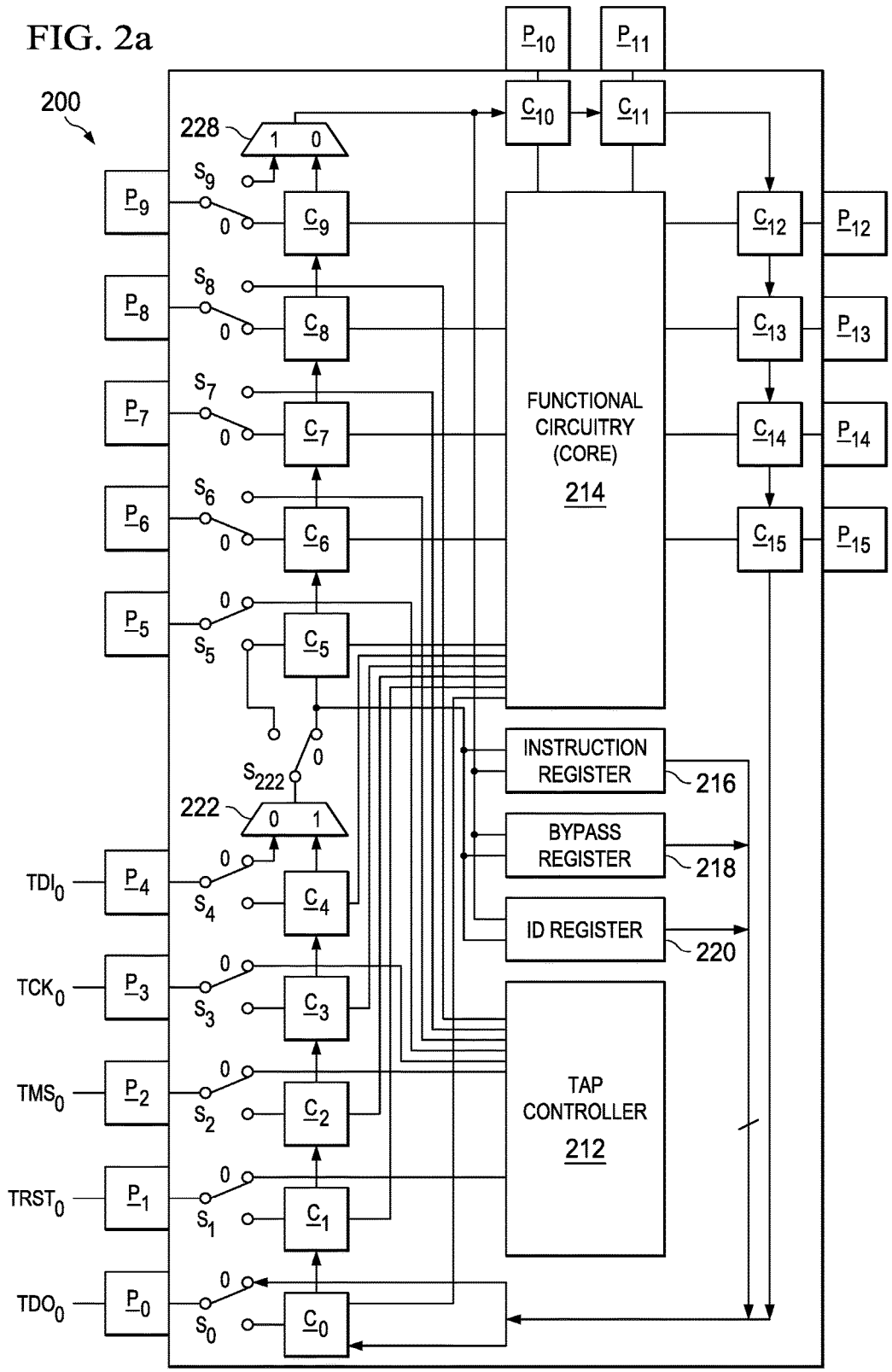

FULL PAD COVERAGE BOUNDARY SCAN

CROSS-REFERENCES TO RELATED APPLICATIONS

This application is a Divisional of application Ser. No. 15/143,454 filed Apr. 29, 2016, now U.S. Pat. No. 9,791,505.

STATEMENT REGARDING FEDERALLY SPONSORED RESEARCH OR DEVELOPMENT

Not Applicable.

BACKGROUND OF THE INVENTION

The preferred embodiments relate to boundary scan of integrated circuits and printed circuit boards.

Boundary scan is a method and related circuiting for testing logic, memories, and other circuits on an integrated circuit (IC) or printed circuit board (PCB). Typically for boundary scan, four or five pins are included on an IC, each corresponding to a respective dedicated test access port (TAP) signal for testing interconnects on either the IC or a PCB into which the IC is assembled. Specifically, the TAP signals may be used to determine whether an IC is properly functioning, whether it is connected to the PCB, and also for debugging by observing IC pin states or measured voltages. Testing may be achieved at the time of manufacture, such as by automated testing equipment (ATE), as well as subsequent testing in the field (e.g., once a device has been sold or located in the marketplace). Additional details as well as standardization in connection with boundary scan were developed by the Joint Test Action Group (JTAG) and are specified in an IEEE 1149 standard and its .x sub-standards.

By way of further background, FIG. 1 illustrates an electrical block diagram of an IC 10 having a boundary scan architecture according to the prior art. For purposes of simplifications, IC 10 is shown to include a test access port TAP controller 12 for interfacing with TAP signals and as relating to JTAG testing, as well as IC functional circuitry 14, sometimes referred to as a core, which is a general depiction of the various circuit functions of IC 10, apart from JTAG testing. IC 10 also includes a number of I/O pads $P_0$ through $P_{15}$, shown at various locations around the perimeter of the device. Pads $P_0$ through $P_4$ carry respective and known JTAG TAP related signals, as shows In the following Table 1.

TABLE 1

| Pin | JTAG Signal | Function |
| --- | --- | --- |
| $P_0$ | TDO | test data out |
| $P_1$ | TRST | test reset |
| $P_2$ | TMS | test mode select |
| $P_3$ | TCK | test clock |
| $P_4$ | TDI | test data in |

As indicated in Table 1, pad $P_4$ allows input of JTAG test data and pad $P_0$ allows output thereof, while the remaining pads $P_1$ through $P_3$ provide signals to TAP controller 12. An instruction register 16 stores a current JTAG instruction, typically to indicate the operation to take with respect to signals that are received (e.g., defining to which data register signals should pass). A bypass register 18 is a single bit register that permits TDI to bypass a chain of cells $C_0$ through $C_{15}$ so as to pass directly from input to output. An ID register 20 is for storing the ID code and revision number for IC 10, thereby allowing IC 10 to be linked to a file that stores boundary scan configuration information for IC 10.

Apart from the JTAG-related pads $P_0$ through $P_4$, each of the remaining IC pads $P_5$ through $P_{15}$ is connected through a respective boundary scan cell $C_5$ through $C_{15}$, to functional circuitry 14. Thus, such pads represent the I/O of IC 10, in connection with its intended operation as achieved by functional circuitry 14. In addition, however, and in connection with JTAG testing, each of scan cells $C_5$ through $C_{15}$ is connected to at least one other scan cell, thereby forming a scan chain whereby for JTAG purposes data may be input by a respective pad to each cell, or captured in each cell from functional circuitry 14, and then such data may be successively shifted along the chain so that it is output from the last such cell $C_{15}$ as TDO information. In this manner, therefore, the I/O connectivity as well as data states from functional circuitry 14 may be evaluated so as to confirm proper operation of IC 10.

While the preceding has proven effective in IC and PCB testing across numerous architectures, the IEEE 1149.x standard requires that the JTAG pads themselves are not connected to respective scan cells and accordingly by way of example in FIG. 1 pads $P_0$ through $P_4$ are not connected to such respective cells. Such a mandate, however, provides limitations as improved by the preferred embodiments, as further detailed below.

BRIEF SUMMARY OF THE INVENTION

In a preferred embodiment, there is an integrated circuit, comprising functional circuitry and testing circuitry. The integrated circuit also comprises a first set of pads operable in a first state for communicating testing signals lo the testing circuitry and operable in a second state for communicating input/output signals to the functional circuitry. The integrated circuit also comprises a second set of pads, differing from the first set of pads, operable in the second state for communicating testing signals to the testing circuitry for testing signals associated in the second state with the first set of pads.

Numerous other inventive aspects and preferred embodiments are also disclosed and claimed.

BRIEF DESCRIPTION OF THE SEVERAL VIEWS OF THE DRAWING

FIG. 2a illustrates an electrical block diagram of an IC 200 according to a preferred embodiment and in a first switched state for receiving a first set of JTAG test signals.

DETAILED DESCRIPTION OF EMBODIMENTS

Figure 1:
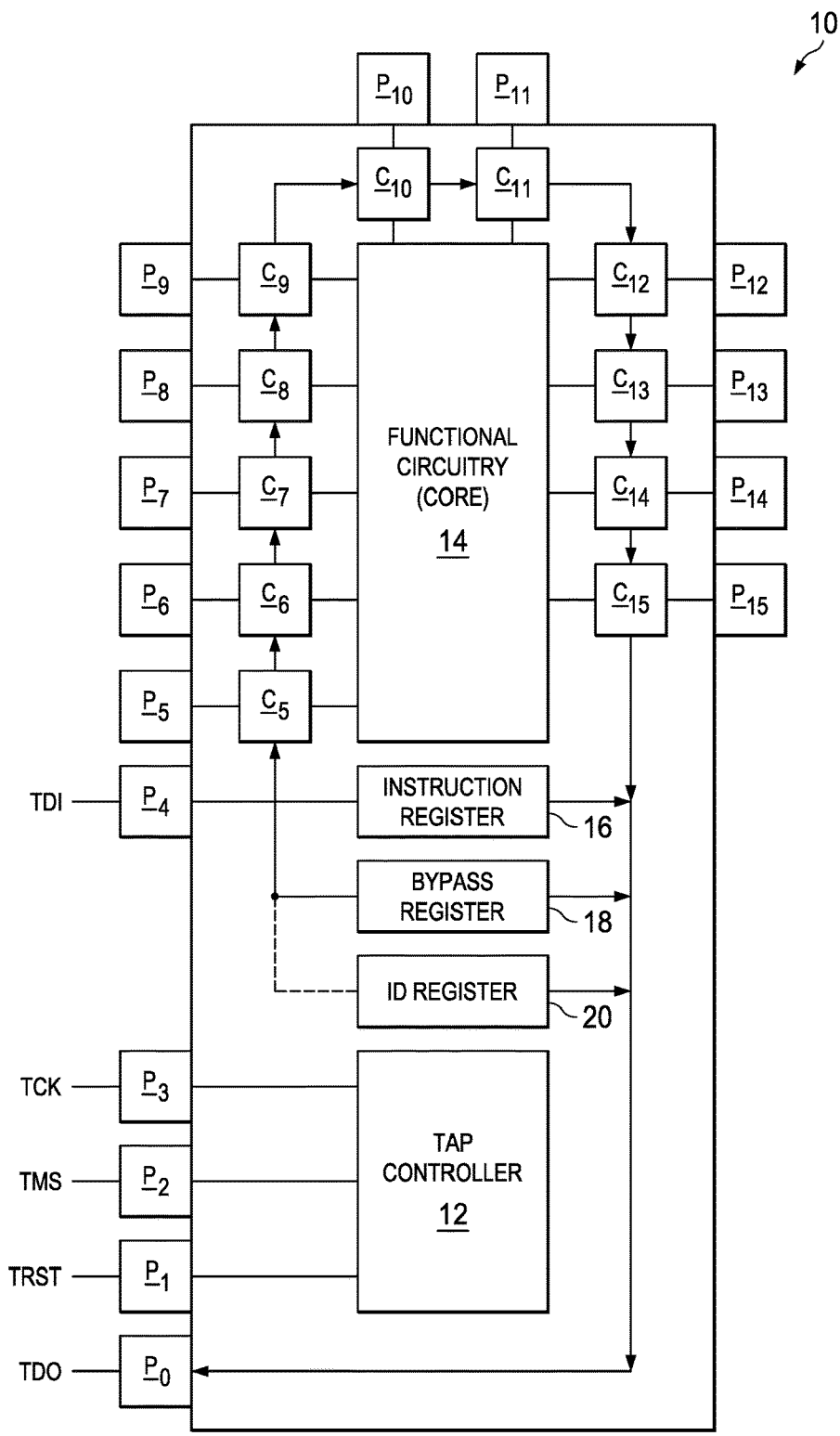
FIG. 1 illustrates an electrical block diagram of an IC 10 having a boundary scan architecture according to the prior art.

FIG. 1 was described in the above Background Of The Invention section of this document, and the reader is assumed familiar with that discussion.

Figure 2B:
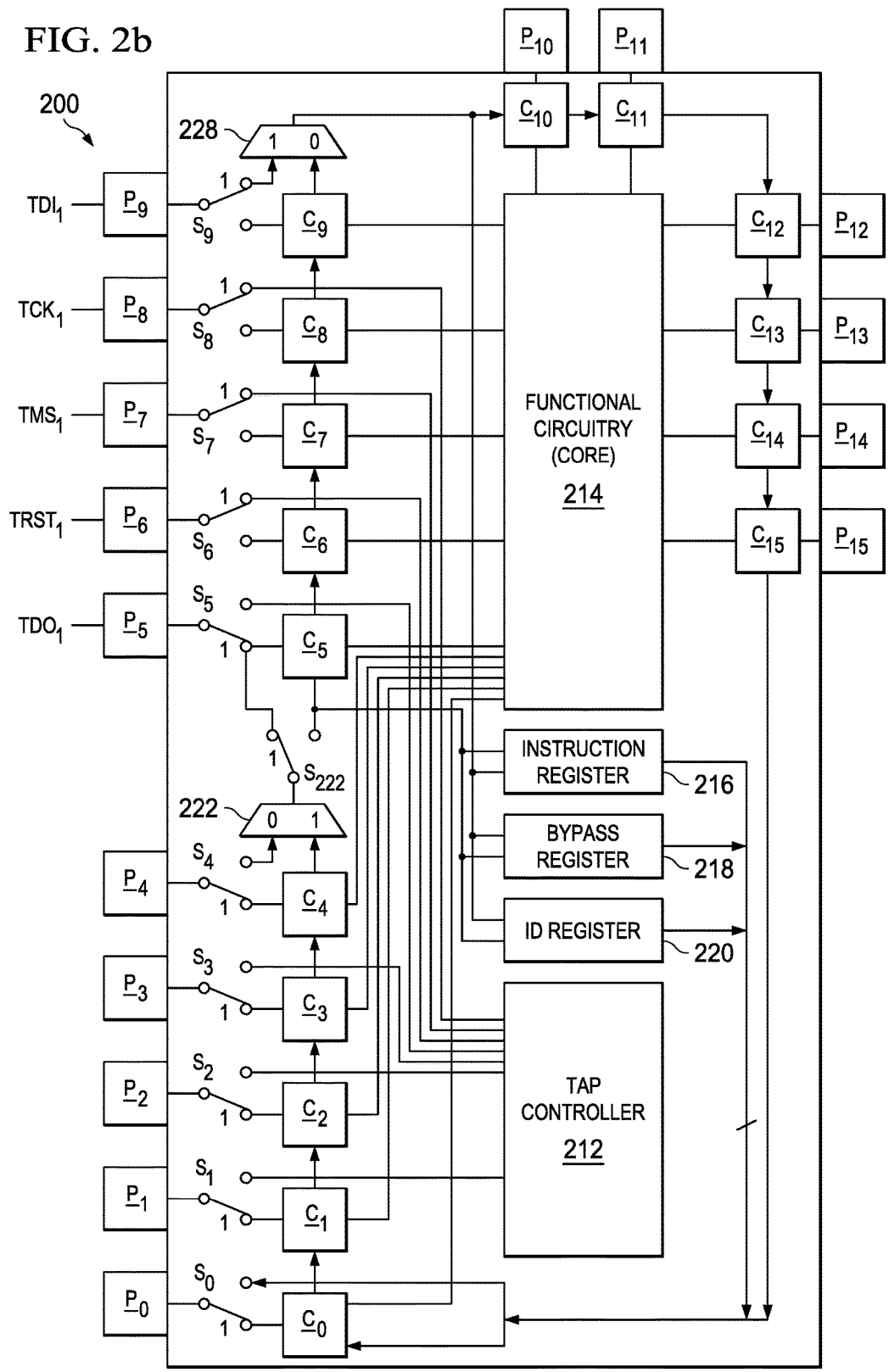
FIG. 2b illustrates an electrical block diagram of the IC 200 of FIG. 2a and in a second switched state for receiving a second set of JTAG test signals.

FIGS. 2a and 2b illustrate an electrical block diagram of an IC 200 according to a preferred embodiment. By way of introduction, IC 200 includes various functional blocks comparable to those described earlier in connection with FIG. 1, where, for sake of ease in understanding, those blocks in FIGS. 2a and 2b are numbered by adding 200 to the reference number of FIG. 1. Thus, in connection with processing JTAG signals and IC functionality, IC 200 includes a TAP controller 212, functional circuitry (or core) 214, an Instruction register 216, a bypass register 218, and an ID register 220, each of which in general is known in the art. In connection with the preferred embodiments, however, such blocks operate in conjunction with a set of JTAG signals from two different respective sets of pads (or also referred to and known in the art as pins), where in FIG. 2a a first such set of JTAG signals are shown with a subscript of 0 on pads $P_0$ through $P_4$, and in FIG. 2b a second such set of JTAG signals are shown with a subscript of 1 on pads $P_5$ through $P_9$. As further detailed later, therefore, IC 200 is operable in two different states, each of which is achieved with different switched signal paths, where FIG. 2a indicates a first such state indicated in a binary sense as a state of 0, and where FIG. 2b indicates a second such state indicated in a binary sense as a state of 1. As detailed later, such states may be implemented by way of a state machine or comparable control, whereby the two states combined permit a full JTAG boundary scan of all pads of IC 200.

Looking to FIG. 2a in greater detail, IC 200 includes a number of pads $P_0$ through $P_{15}$, so that by way of example IC 200 is a 16-pin device. Further, for each pad, there is a respective boundary scan cell $C_0$ through $C_{15}$, thereby forming a boundary cell scan chain; thus, in contrast to the prior art wherein fixed JTAG pads do not have corresponding boundary scan rails as represented by way of example in FIG. 1, in a preferred embodiment each device pad has a corresponding boundary scan cell, for reasons further appreciated in the remainder of this document.

As introduced above, a first set of pads, namely pads $P_0$ through $P_4$, are shown in FIG. 2a for receiving a first set of JTAG signals, as summarized in the following Table 1:

TABLE 1

| Pad | JTAG signal |
| --- | --- |
| $P_0$ | $TDO_0$ |
| $P_1$ | $TRST_0$ |
| $P_2$ | $TMS_0$ |
| $P_3$ | $TCK_0$ |
| $P_4$ | $TDI_0$ |

Moreover, each of the Table 1 pads $P_0$ through $P_4$ is connected to a respective switching element $S_0$ through $S_4$ so that in a first state as shown in FIG. 2a, each such switching element interconnects the pad so that its respective JTAG signal is appropriately routed to achieve JTAG testing. In this first state, therefore, (i) pads $P_1$ through $P_3$ are connected to TAP controller 212; (ii) pad $P_0$ is connected to receive data as $TDO_0$ from boundary scan cell $C_{15}$, the last cell in the sequence of cells forming the boundary chain as configured in FIG. 2a; and (iii) pad $P_4$ is connected so that its $TDI_0$ signal may be input, via a multiplexer 222 and switching element $S_{222}$, to the boundary scan chairs, starting at boundary scan cell $C_5$, and also that signal is connected to instruction register 216, bypass register 218, and ID register 220.

IC 200 as shown in FIG. 2a also includes a second set of pads, namely pads $P_5$ through $P_9$, each of which is connected to a respective switching element $S_5$ through $S_9$ so that in the first state, as shown in FIG. 2a, each such switching element interconnects the pad to a respective boundary scan cell in the scan cell chain, as summarized in the following Table 2:

TABLE 2

| Pad | Cell |
| --- | --- |
| $P_5$ | $C_5$ |
| $P_6$ | $C_6$ |
| $P_7$ | $C_7$ |
| $P_8$ | $C_8$ |
| $P_9$ | $C_9$ |

Moreover, in the first state, each of boundary cells $C_5$ through $C_9$ provides an exclusive pass-through connectivity path between a respective pad, through the cell, to functional circuitry 214. Exclusive in this regard is intended to indicate that in a preferred embodiment, each boundary pad only permits pass through between one respective pin and functional circuitry 214. Such connectivity, therefore, allows signals from either the pad or functional circuitry 214 to be captured in a respective cell, and the signal then may be shifted to a next successive cell, in sequential fashion, so that ultimately the signal is provided as output data TDO from the scan cell chain.

IC 200 also includes pads beyond those in the first or second set of pads, where such additional pads may therefore be considered a third set of pads, which are not operable to receive JTAG signals. In the example of FIG. 2a, this third set of pads is shown as pads $P_{10}$ through $P_{15}$. Each pad in the third set of pads preferably is directly connected, that is without a switching element as are the first and second set of pads, to a respective and exclusive pass-through boundary scan cell in the chain, as summarized in the following Table 3:

TABLE 3

| Pad | Cell |
| --- | --- |
| $P_{10}$ | $C_{10}$ |
| $P_{11}$ | $C_{11}$ |
| $P_{12}$ | $C_{12}$ |
| $P_{13}$ | $C_{13}$ |
| $P_{14}$ | $C_{14}$ |
| $P_{15}$ | $C_{15}$ |

Again, therefore, the exclusive connectivity path between a respective pad, through the cell, to functional circuitry 214, allowing signals from either the pad or functional circuitry 214 to be captured in a respective cell, and the signal may then be shifted to a next successive cell, in sequential fashion, so that ultimately the signal is provided as output data TDO from the scan cell chain.

Completing FIG. 2a, boundary cell $C_{15}$ is also output to the input of a de-multiplexer 224, which has a first output that, for a 0 state, connects the de-multiplexer input, via switching element $S_0$, to pad $P_0$, so that in that state the output of cell $C_{15}$ is connected to pad $P_0$. For reasons described later, de-multiplexer 224 also has a second output that, for a 1 state, connects the de-multiplexer input to boundary scan cell $C_0$. Moreover, each of the outputs of instruction register 216, bypass register 218, and ID register 220 is connected to an input of a multiplexer 226, which has a first output that, for a 0 state, connects the de-multiplexer input to the input of multiplexer 224; as described above, therefore, the latter during a 0 state connects its input to pin $P_0$ (as $TDO_0$) so that, during this state, the outputs of those registers may be connected to pin $P_0$.

Looking to FIG. 2b in greater detail, IC 200 is shown in a second state, indicated with the number 1 corresponding to the position of various switch positions and de-multlplexer selections. In this regard, therefore, the signal path for the scan chain of boundary cells from FIG. 2a is switched to a different path in FIG. 2b, thereby establishing that the scan chain is configurable in the sense that, in the first state, signals from a first set of pads (e.g., $P_0$ through $P_4$) do not pass to respective boundary cells, and in the second state, signals from a second set of pads (e.g., $P_5$ through $P_9$) do not pass to respective boundary cells. In this regard, therefore, in FIG. 2b, a second set of pads receives a second set of JTAG signals, as summarized in the following Table 4:

TABLE 4

| Pad | JTAG signal |
|---|---|
| $P_5$ | $TDO_1$ |
| $P_6$ | $TRST_1$ |
| $P_7$ | $TMS_1$ |
| $P_8$ | $TCK_1$ |
| $P_9$ | $TDI_1$ |

Each second state JTAG signal is connected to a respective switching element so that in the second state, as shown in FIG. 2b, each such switching element interconnects a pad so that its respective JTAG signal is appropriately routed to achieve JTAG testing and note further that the routing bypasses the pass-through boundary scan cell to which such pads are respectively exclusively connected (i.e., cells $C_5$ through $C_9$) in state 0. In this second state, therefore, (i) pads $P_6$ through $P_8$ are connected to TAP controller 212; (ii) pad $P_5$ is connected to receive, via multiplexer 222 and switch element $S_5$ data as $TDO_1$ from boundary scan cell $C_4$, the last cell in the sequence of cells forming the boundary chain as configured in FIG. 2b; and (iii) pad $P_9$ is connected so that its $TDI_1$ signal may be input, via multiplexer 228, to the boundary scan chain, starting at boundary scan cell $C_{10}$, and also that signal is connected to instruction register 216, bypass register 218, and ID register 220.

IC 200 as shown in FIG. 2b also again includes the first set of pads, but note that due to the change in the connectivity to the configurable scan chain of boundary cells, each pad in the first set of pads, namely pads $P_0$ through $P_4$, is in the second state connected, via a respective switching element $S_0$ through $S_4$, to a respective boundary scan cell in the scan cell chain, as summarized in the following Table 5:

TABLE 5

| Pad | Cell |
|---|---|
| $P_0$ | $C_0$ |
| $P_1$ | $C_1$ |
| $P_2$ | $C_2$ |
| $P_3$ | $C_3$ |
| $P_4$ | $C_4$ |

Moreover, each of boundary cells $C_0$ through $C_4$ is also connected to functional circuitry 214.

Completing FIG. 2b, IC 200 again includes pads beyond those in the first or second set of pads, where such additional pads may therefore be considered a third set of pads, which are not operable to receive JTAG signals. Thus, as in the example of FIG. 2a, in FIG. 2b again this third set of pads is shown as pads $P_{10}$ through $P_{15}$, each directly connected to a respective boundary scan cell in the chain, as summarized in the above Table 3.

Figure 3:
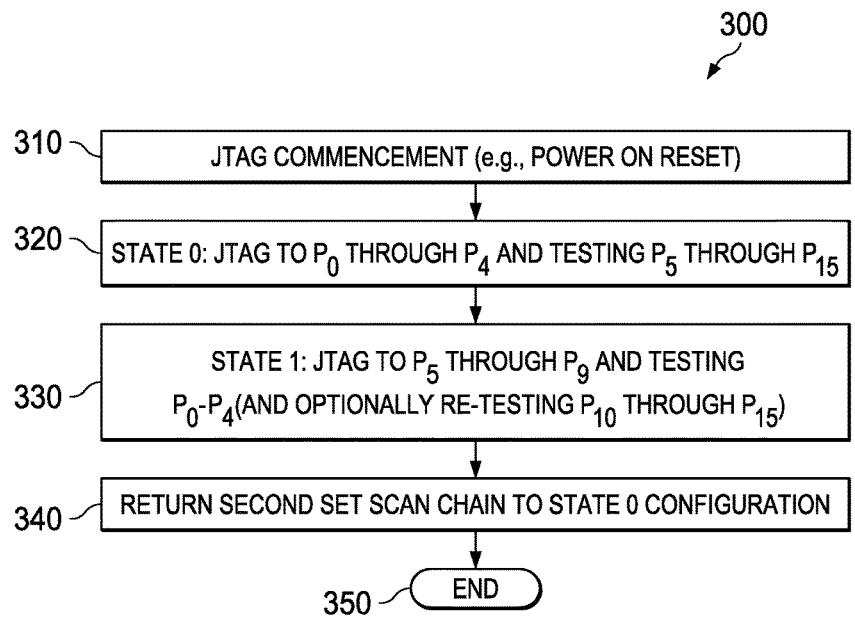
FIG. 3 illustrates a flow chart of a preferred embodiment method 300 of operation of IC 200.

FIG. 3 illustrates a flow chart of a preferred embodiment method 300 of operation of IC 200. Method 309 may be achieved by way of a state machine Included as part of TAP controller 212 or by other circuitry and control, either located singularly on IC 200 or in part external from it, such as with automated testing equipment (ATE). Method 300 commences with a JTAG testing commencement step 310, where by way of example such testing may be at a manufacturer location, such as via ATE, or later in the field, either at the IC or PCB level. In one preferred embodiment, step 310 may occur when IC 200 is powered on, that is, as part of the power on reset procedure.

After step 310, method 300 continues to step 320. In step 320, IC 200 is operated in the above-described first state 0, in which case the switching element, multiplexing and de-multiplexing is as shown in FIG. 2a. At the same time, a first set of JTAG signals (e.g., four or five signals, per contemporary standards) is applied to a first set of pads that in the given state are not connected to respective exclusive pass-through boundary chain cells, and each of those JTAG signals is appropriately routed based on the particular signal and as described earlier. Thus, the earlier-shown Table 1 provides an example for this first set of JTAG signals. With such connectivity, JTAG testing is then performed with respect to the remaining pads on IC 200, which in the present example is pads $P_5$ through $P_{15}$, thereby testing those pads in connection with the respective cells shown in Tables 2 and 3. Thus, pad $P_4$ can Introduce TDI data to the boundary scan chain, which in state 0 is configured to begin with cell $C_5$ and proceed through cell $C_{15}$, and signal states may be transferred between those cells and functional circuitry 214 as well as advanced along the configurable scan chain and produced as TDO data that is output via pad $P_0$. Other JTAG testing, as known to or discernable by one skilled in the art, also may be achieved during and with the configured boundary chain of step 320.

After step 320, method 300 continues to step 330. In step 330, IC 200 is operated in the above-described second state 1, in which case the switching elements, multiplexing and de-multiplexing is as shown in FIG. 2b. At the same time, a second set of JTAG signals (e.g., four or five signals, per contemporary standards) Is applied to a second set of pads, differing from the first set, and that in the given state are not connected to respective exclusive pass-through boundary chain cells, where this second set of JTAG signals also are appropriately routed based on the signal and as described earlier. Thus, the earlier-shown Table 4 provides an example for this second set of JTAG signals. With such connectivity, JTAG testing is thee performed with respect to at least those pads that were JTAG-connected in state 0, those being pads $P_0$ through $P_4$; in addition, also with the FIG. 2b configuration, again testing can be repeated (or alternate testing performed) with respect to the third set of pads, that is, pads $P_{10}$ through $P_{15}$. Thus, pad $P_9$ can introduce TDI data to the boundary scan chain, which in state 1 is configured to begin with cell $C_{10}$, continue through $C_{15}$, and proceed back to and include cells $C_0$ through $C_4$, but again to exclude the cells (i.e., $C_5$ though $C_9$) corresponding to those pads receiving JTAG signals. Thus, having concludes step 330, note therefore that in step 320, a first set of pads is used for receiving JTAG signals to test pads not in the first set, and then in step 330, a second set of pads, differing from the first set of pads, may be used for receiving JTAG signals in order to test the first set of pads.

After step 330, method 300 continues to step 340. In step 340, the second set of pads of IC 200 is re-configured back to the state 0 configuration, after which IC 200 may be operated according to the device specifications and the pad assignments for each pad. In this respect, therefore, note that the second set of pads for IC 200 may be dual purpose pads, serving during testing as JTAG pads (in state 1 testing), and once re-configured in step 340 those pads are connected through respective scan cells to functional circuitry 214. Thereafter, method 300 concludes in step 350.

Figure 4:
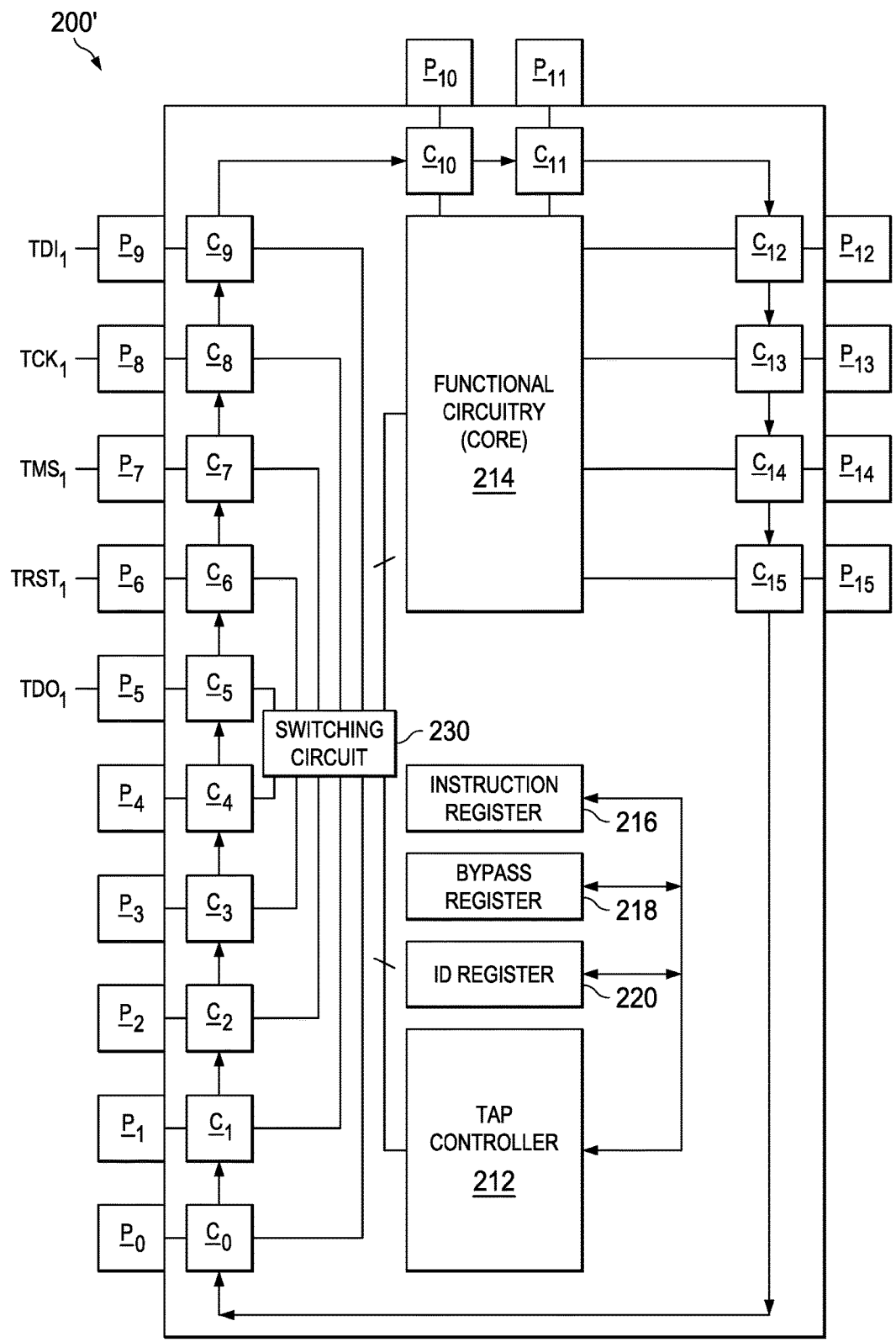
FIG. 4 illustrates an electrical block diagram of an alternative preferred embodiment IC 200'.

FIG. 4 illustrates an alternative preferred embodiment IC 200', which shares various functional and structural aspects with the above-described IC 200. In general, therefore, an IC is provided with: (i) a first set of pads operable in a first state for communicating testing signals to the testing circuitry and operable in a second state for communicating input/output signals to the functional circuitry; and (ii) a second set of pads, differing from the first set of pads, operable in the second slate for communicating testing signals to the testing circuitry for testing signals associated in the second state with the first set of pads. For IC 200', however, the alternating sets of pads are facilitated with a switching circuit 230 to which the two sets of pads are connected, whereby switching circuit 230 may communicate signals between the pads and functional circuitry 214 as well as tap controller 212. Moreover, tap controller 212 is operable to bi-directionally communicate with any of instruction register 216, bypass register 218, and ID register 220, so both of the two sets of pads (one for the first state, one for the second state) permit JTAG signals to be multiplexed in circuit 230 so that a single output set of JTAG signals drives the TAP logic (e.g., by coupling them to tap controller 212, which may then further bi-directionally communicate as needed with ID register 220, bypass register 218, and instruction register 216), as well as to serve any other JTAG functionality known in the art. One skilled in the art will readily contemplate various alternatives for implementing the requisite switching apparatus in both circuit 230 and controller 212 in this regard. Also for IC 200', a particular cell structure may be implemented in lieu of the switching and multiplexing apparatus shown in FIGS. 2a and 2b, as further described below in connection with FIG. 5.

Figure 5:
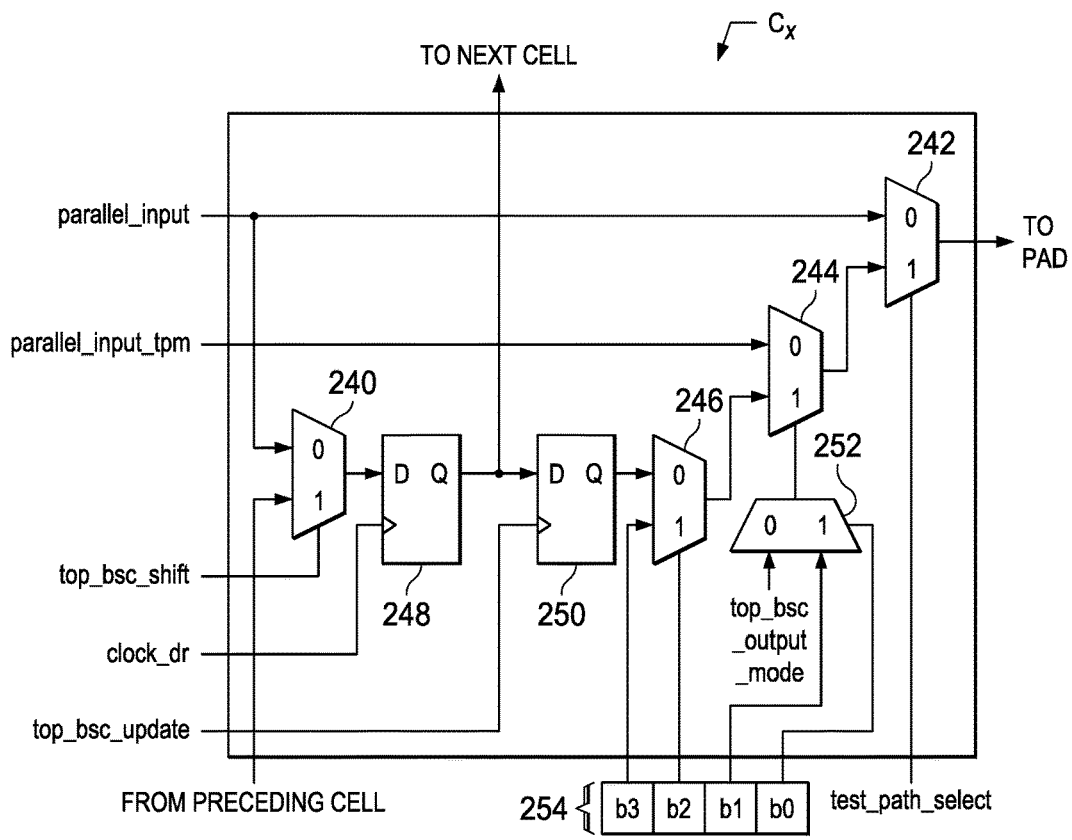
FIG. 5 illustrates a structure for a cell $C_x$ that may be used for cells in IC 200' of FIG. 4.

FIG. 5 illustrates a structure for a cell $C_x$ that may be used for the output and serial chain path any of cells $C_0$ through $C_{15}$ in IC 200' of FIG. 4, where comparable circuitry or a portion thereof likewise may be implemented for the input path thereof. As will now be demonstrated, with the structure of cell $C_x$, the entire boundary scan chain may be the same across different configurations of shared pads, with additional structure as now described ensuring that values shifted between cells that correspond to respective pads being used for JTAG do not propagate and affect the pads. Cell $C_x$ includes the following Input or control signals:

parallel_input: data from a functional pin muxing module (that may be included as part of functional circuitry 214) whereby signals related to functional use case (e.g., SPI, UART . . . ) are multiplexed as part of functional pin muxing module, and this signal is a first data input to a multiplexer 240, where a second data input to multiplexer 240 is the serial chain data from the preceding cell $C_{x-1}$ in the scan chain. Note also that parallel_input is also input as a first data input to a multiplexer 242, where the second data input to multiplexer 242 is the output of a multiplexer 244.

parallel_input_tpm; data from a test pin muxing module, whereby signals related to test use case (e.g., scan, dmled, . . . ) are multiplexed as part of test pin muxing module, and this signal is a first data input to multiplexer 244, where the second data input to multiplexer 242 is the output of a multiplexer 246.

top_bsc_shift: controls multiplexer 240 to select between either the parallel_input signal or the shifted data from the preceding cell $C_{x-1}$ in the scan chain.

clock$_{13}$ dr: clocks a serial register flip flop 248 to clock in the data from the output of multiplexer 240 while outputting data to a latch out register flip flop 250.

top_bsc_update: clocks latch out register flip flop 250 to clock in the data from the output of serial register flip flop 247 while outputting to a first data value Input to multiplexer 246.

top_bsc_output_mode: a signal to specify extest mode where a boundary scan cell drives I/O, and this signal is a first data input to a multiplexer 252.

test_path_select: a control signal input to a multiplexer 252 to select parallel_input_tmp to be output to the pad to enable design for testing (DFT) test path related to scan/dmled/PBIST, etc.

In addition, associated with cell $C_x$ s a four bit data register 254, where its four bits are connected as follows:
b0: control of multiplexer 241.
b1: a second data value input to multiplexer 252.
b2: control of multiplexer 246.
b3: a second data value input to multiplexer 246.

The operation of cell $C_x$ is as follows. By way of introduction, recall that the IC 200 of FIGS. 2a and 2b depict switches, and certain multiplexers, so that in one state a first set of pads may be used for JTAG pins, while a second set of pads couples signals to respective cells; in that case, for the first set, the switches allow certain cells to be bypassed. In providing a comparable result, in IC 200', for FIG. 5, cell $C_x$ may for one state output non-JTAG test or other data to the pad and for another state JTAG scan chain data may be output to the pad. Specifically, bits in register 254 are programmed (or alternatively hard-coded) to select either the path from "parallel_input_tpm" or that of the latch_out register 250 (i.e., by controlling multiplexer 246), so that the selected choice may then pass through multiplexer 242 to the pad. Thus, serial register 248 is part of the boundary scan chain in both states, making the entire boundary scan chain the same across different configurations, while the register 254 (or hard-coded) values ensure that a shifted in value in serial register 248 does not propagate to and affect the pads when not desired. Specifically, in a first state where a first set of pads are used for JTAG testing, the serial register 248 for each cell $C_x$ corresponding to such pads will get some shifted in value from a preceding cell in the chain, but that value does not propagate to the pad and hence the pad continues to function as required for the test (i.e., by providing parallel_input_tpm instead to the pad). And in a second state where a second set of pads are used for JTAG testing, the serial register value in the cells corresponding to the first set of JTAG pads is allowed to propagate (via register 250 and multiplexers 246, 244, and 242) to each respective pad, thereby ensuring that they are controllable and testable through boundary scan testing.

Given the preceding, the preferred embodiments provide improvements in boundary scan of ICs and printed circuit boards (PCBs). Specifically, the preferred embodiment IC allows the sharing of pads so that in a first state those pads may be used for JTAG testing wherein during that state the pins bypass or otherwise are not pass-through connected to the configurable scan chain (although the TDI and TDO pads are serially connected for inputting and outputting data from the chain, rather than passing through data to functional circuitry 214), whereas in a second state the pads are used for non-JTAG signals that are pass-through connected to exclusive respective scan cells and additional pads are used for JTAG testing of the dual-use pads during that second state. Thus, a set of IC pads may serve a second function beyond JTAG testing, such as for a functional interface such as an input/output for a universal asynchronous receiver/transmitter (UART) or as a serial peripheral interface (SPI). Thus, for low pad count devices such as low power radio frequency devices, a first set of pads may be shared for two different functions, one being JTAG and the other not relating to JTAG, where nonetheless the pads (and associated signals and functions) themselves may be JTAG tested in a state where those pads are not serving as JTAG pads and a second set of JTAG pads are temporarily enabled via a configurable scan chain. Note that reference to "low pad count" may vary based on application or considerations of one skilled in the art, so preferred embodiments may be less than 64 pads, less than 32 pads, or less than 16 pads. Such an approach reduces device cost as the number of pads can be reduced, or full JTAG testing for all pads is enabled in relatively low pad number devices. Thus, preferred embodiments permit 100 percent input/output test coverage on devices sharing JTAG pads for functional interfaces, as may be an important requirement for certain (e.g., safety, automotive) qualification. In addition, board testing typically requires two different access protocols for devices with dual-use pads where one use is JTAG and for which scan chain JTAG testing is not permitted of the dual-use pads because there is no corresponding boundary cells for such pads (i.e., see FIG. 1), while the preferred embodiment can eliminate the dual requirement. Thus, the preferred embodiments improve the prior art. Moreover, while various aspects have been described, substitutions, modifications or alterations can be made to the descriptions set forth above without departing from the inventive scope. For example, while FIGS. 2a and 2b illustrate one example of switching configurations to create the configurable scan chain of boundary cells so as to bypass pass-through connectivity of selected cells for JTAG testing in respective different states, various alternatives may be created given the inventive scope taught herein. As another example, while a preferred embodiment is shown to include 16 pads, various other numbers of pads may be implemented. As yet another example, preferred embodiments may be created to include or exclude the optional TEST (test reset) JTAG signal. Still other examples will be ascertainable by one skilled in the art and are not intended as limiting to the inventive scope, which instead is defined by the following claims.

The invention claimed is:

1. A method of testing circuit operability, comprising:
    in a first state, applying a first set of test signals to a first set of pads of an integrated circuit comprising functional circuitry and testing circuitry and for communicating the first set of signals to the testing circuitry; and
    in a second state, applying a second set of test signals to a second set of pads of an integrated circuit, differing from the first set of pads, and communicating the second set of signals to the testing circuitry for testing signals associated with the first set of pads.

2. The method of claim 1 wherein the testing circuitry comprises a configurable scan chain comprising a plurality of scan cells, wherein each cell in the plurality of scan cells is associated with a respective pad in one of the first set of pads and the second set of pads.

3. The method of claim 2 and further comprising:
    configuring the configurable scan chain in the first state so that a first set of pads communicate testing signals that bypass respective scan cells in the configurable scan chain; and
    configuring the configurable scan chain in the second state so that the second set of pads communicate testing signals that bypass respective scan cells in the configurable scan chain and are for testing boundary cells connected in the second state to respective pads in the first set of pads.

4. The method circuit of claim 2 wherein each scan cell in the plurality of scan cells comprises:
    a serial register for receiving serial chain data; and
    circuitry for blocking serial chain data in the serial register from reaching a pad corresponding to the serial register when the cell is operated for communicating testing signals to the testing circuitry for testing signals associated in the second state with the first set of pads.

5. The method of claim 1 wherein the testing signals in the first state and the testing signals in the second state comprise JTAG signals.

6. The method of claim 1 wherein the first set of pads comprises dual use pads.

7. The method of claim 1 wherein the first set of pads comprise pads for at one time communicating JTAG testing signals and pads for another time communicating UART signals.

8. The method of claim 1 wherein the first set of pads comprise pads for at one time communicating JTAG testing signals and pads for at another time communicating SPI signals.

9. An apparatus, comprising:
    circuitry for applying a first set of test signals to a first set of pads of an integrated circuit comprising functional circuitry and testing circuitry and for communicating the first set of signals to the testing circuitry; and
    circuitry for applying a second set of test signals to a second set of pads of an integrated circuit, differing from the first set of pads, and communicating the second set of signals to the testing circuitry for testing signals associated with the first set of pads.

10. The apparatus of claim 9 further including a configurable scan chain comprising a plurality of scan cells, wherein each cell in the plurality of scan cells is associated with a respective pad in one of the first set of pads and the second set of pads.

11. The apparatus of claim 10 further comprising:
    circuitry for configuring the configurable scan chain in the first state so that a first set of pads communicate testing signals that bypass respective scan cells in the configurable scan chain; and
    circuitry for configuring the configurable scan chain in the second state so that the second set of pads communicate testing signals that bypass respective scan cells in the configurable scan chain and are for testing boundary cells connected in the second state to respective pads in the first set of pads.

12. The apparatus of claim 10 wherein each scan cell in the plurality of scan cells comprises:
    a serial register for receiving serial chain data; and
    circuitry for blocking serial chain data in the serial register from reaching a pad corresponding to the serial register when the cell is operated for communicating testing signals to the testing circuitry for testing signals associated in the second state with the first set of pads.

13. The apparatus of claim 9 wherein the testing signals in the first state and the testing signals in the second state comprise JTAG signals.

14. The apparatus of claim 9 wherein the first set of pads comprises dual use pads.

15. The apparatus of claim 9 wherein the first set of pads comprise pads for at one time communicating JTAG testing signals and pads for another time communicating UART signals.

16. The apparatus of claim 9 wherein the first set of pads comprise pads for at one time communicating JTAG testing signals and pads for at another time communicating SPI signals.

17. An apparatus, comprising:
means for applying a first set of test signals to a first set of pads of an integrated circuit comprising functional circuitry and testing circuitry and for communicating the first set of signals to the testing circuitry; and
means for applying a second set of test signals to a second set of pads of an integrated circuit, differing from the first set of pads, and communicating the second set of signals to the testing circuitry for testing signals associated with the first set of pads.

18. The apparatus of claim 17 further including a configurable scan chain comprising a plurality of scan cells, wherein each cell in the plurality of scan cells is associated with a respective pad in one of the first set of pads and the second set of pads.

19. The apparatus of claim 18 further comprising:
means for configuring the configurable scan chain in the first state so that a first set of pads communicate testing signals that bypass respective scan cells in the configurable scan chain; and
means for configuring the configurable scan chain in the second state so that the second set of pads communicate testing signals that bypass respective scan cells in the configurable scan chain and are for testing boundary cells connected in the second state to respective pads in the first set of pads.

20. The apparatus of claim 19 wherein each scan cell in the plurality of scan cells comprises:
a serial register for receiving serial chain data; and
means for blocking serial chain data in the serial register from reaching a pad corresponding to the serial register when the cell is operated for communicating testing signals to the testing circuitry for testing signals associated in the second state with the first set of pads.

21. The apparatus of claim 19 wherein the testing signals in the first state and the testing signals in the second state comprise JTAG signals.

22. The apparatus of claim 19 wherein the first set of pads comprises dual use pads.

23. The apparatus of claim 19 wherein the first set of pads comprise pads for at one time communicating JTAG testing signals and pads for another time communicating UART signals.

24. The apparatus of claim 19 wherein the first set of pads comprise pads for at one time communicating JTAG testing signals and pads for at another time communicating SPI signals.

* * * * *